United States Patent
Ebata et al.

(10) Patent No.: US 9,657,388 B2
(45) Date of Patent: *May 23, 2017

(54) GAS BARRIER FILM

(71) Applicant: TOYOBO CO., LTD., Osaka-shi, Osaka (JP)

(72) Inventors: Takashi Ebata, Otsu (JP); Kiyoshi Iseki, Otsu (JP)

(73) Assignee: Toyobo Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/764,266

(22) PCT Filed: Feb. 5, 2014

(86) PCT No.: PCT/JP2014/052669
§ 371 (c)(1),
(2) Date: Jul. 29, 2015

(87) PCT Pub. No.: WO2014/123155
PCT Pub. Date: Aug. 14, 2014

(65) Prior Publication Data
US 2015/0376769 A1    Dec. 31, 2015

(30) Foreign Application Priority Data

Feb. 6, 2013  (JP) ................................. 2013-021809

(51) Int. Cl.
C08J 7/06  (2006.01)
C23C 14/12  (2006.01)
(Continued)

(52) U.S. Cl.
CPC ............... C23C 14/24 (2013.01); B05D 1/60 (2013.01); B05D 7/04 (2013.01); C08J 7/065 (2013.01);
(Continued)

(58) Field of Classification Search
None
See application file for complete search history.

(56) References Cited

U.S. PATENT DOCUMENTS 5,089,851 A *  2/1992  Tanaka ............... G03G 15/0233
                                                        361/225
2007/0184187 A1  8/2007  Jahromi
(Continued)

FOREIGN PATENT DOCUMENTS

CN  102015289 A  4/2011
JP  H02-233666 A  9/1990
(Continued)

OTHER PUBLICATIONS

Japanese Patent Office, International Search Report in International Patent Application No. PCT/JP2014/052669 (Apr. 22, 2014).
(Continued)

Primary Examiner — Ramsey Zacharia
(74) Attorney, Agent, or Firm — Leydig, Voit & Mayer, Ltd.

(57) ABSTRACT

Provided is a gas barrier film having superior gas barrier properties even when an organic gas barrier layer is provided to the surface of a plastic film. The gas barrier film is provided with an organic gas barrier layer containing a 1,3,5-triazine derivative at least at one surface of the plastic film, and is characterized by the 1,3,5-triazine derivative having as a substituent group a group containing sulfur at position 2, 4, or 6.

8 Claims, 1 Drawing Sheet

(51) Int. Cl.
*C23C 14/24* (2006.01)
*B05D 1/00* (2006.01)
*C23C 14/56* (2006.01)
*B05D 7/04* (2006.01)

(52) U.S. Cl.
CPC ............ *C23C 14/12* (2013.01); *C23C 14/562* (2013.01); *B05D 2252/02* (2013.01)

(56) References Cited

U.S. PATENT DOCUMENTS

| | | |
|---|---|---|
| 2007/0207319 A1 | 9/2007 | Jahromi |
| 2007/0269665 A1 | 11/2007 | Shimoohsako et al. |
| 2010/0119852 A1 | 5/2010 | Tsuchida |
| 2010/0310884 A1 | 12/2010 | Jahromi |
| 2011/0045258 A1 | 2/2011 | Jahromi et al. |
| 2013/0260144 A1 | 10/2013 | Yamazaki et al. |

FOREIGN PATENT DOCUMENTS

| | | | |
|---|---|---|---|
| JP | 1152070 A1 * | 11/2001 | ............ C25D 1/04 |
| JP | 2002-019010 A | 1/2002 | |
| JP | 2005-002334 A | 1/2005 | |
| JP | 2005-288856 A | 10/2005 | |
| JP | 2006-116708 A | 5/2006 | |
| JP | 2007-503529 A | 2/2007 | |
| JP | 2007-508161 A | 4/2007 | |
| JP | 2005-059537 A | 3/2010 | |
| JP | 2010-090186 A | 4/2010 | |
| JP | 2010-111819 A | 5/2010 | |
| JP | 2010-533608 A | 10/2010 | |
| JP | 4863024 B2 | 1/2012 | |
| JP | 2013-014126 A | 1/2013 | |

OTHER PUBLICATIONS

Japanese Patent Office, International Search Report in International Patent Application No. PCT/JP2014/052249 (May 13, 2014).
Japanese Patent Office, Notification of Office Action in Japanese Patent Application No. 2013-021809 (May 31, 2016).
Chinese Patent Office, Notification of First Office Action in Chinese Patent Application No. 201480007809.5 (Apr. 25, 2016).
European Patent Office, Extended European Search Report in European Patent Application No. 14749484.3 (Oct. 11, 2016).
U.S. Appl. No. 14/765,488, filed Aug. 3, 2015.
Chinese Patent Office, Notification of First Office Action in Chinese Patent Application No. 201480007801.9 (Aug. 29, 2016).
European Patent Office, Extended European Search Report in European Patent Application No. 14749514.7 (Aug. 8, 2016).
Chinese Patent Office, Notification of the Second Office Action in Chinese Patent Application No. 201480007809.5 (Nov. 28, 2016).
Chinese Patent Office, Notification of the Third Office Action in Chinese Patent Application No. 201480007809.5 (Mar. 7, 2017).

* cited by examiner

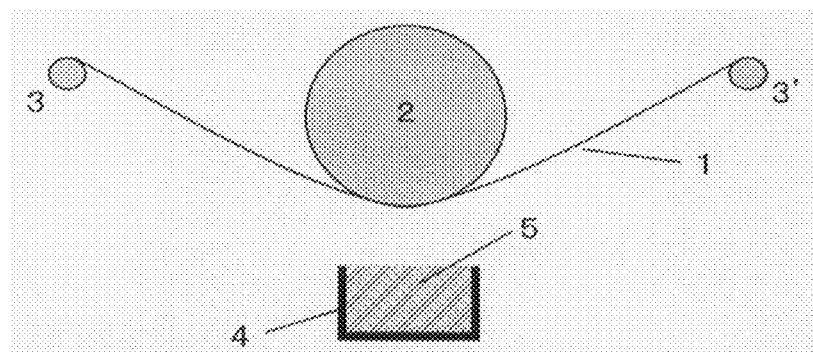

GAS BARRIER FILM

CROSS-REFERENCE TO RELATED APPLICATIONS

This patent application is the U.S. national phase of International Patent Application No. PCT/JP2014/052669, filed Feb. 5, 2014, which claims the benefit of Japanese Patent Application No. 2013-021809, filed on Feb. 6, 2013, which are incorporated by reference in their entireties herein.

TECHNICAL FIELD

The present invention relates to a gas barrier film excellent in gas barrier properties to water vapor and oxygen and suitable as a packaging film for foods, pharmaceutical products, etc.

BACKGROUND ART

There has conventionally been known, as a gas barrier film, a gas barrier laminate film including a plastic film and a thin film of an inorganic oxide such as silicon oxide or aluminum oxide coated on a surface of the plastic film (hereinafter, referred to as inorganic thin film layer).

On the other hand, there is known a method for obtaining gas barrier properties by coating, in place of an inorganic thin film layer, a thin film containing an organic material (hereinafter, referred to as organic thin film layer) on a plastic film. The organic thin film layer is more excellent in flexibility and bending resistance than the inorganic thin film layer, and accordingly the organic thin film layer can obtain more excellent gas barrier properties.

For example, Patent Document 1 proposes a gas barrier layered body including an organic thin film layer containing organopolysiloxane (gas barrier layer). The use of organopolysiloxane having a triazine skeleton effective for causing gas barrier properties and having a triazine dithiol group with a thiol group effective for adhesion to resin being introduced into the skeleton makes it possible to form a gas barrier layer excellent in gas barrier properties, adhesion properties, and flexibility.

Incidentally, an organic thin film layer is formed on a plastic film in most cases by dipping method or spin coating method. In Patent Document 1, the composition for organic thin film layer formation contains an organic polymer compound having a polar functional group as another main raw material besides organopolysiloxane, but the molecular weight of the organic polymer compound is high, so that it is difficult to produce the organic thin film layer by vacuum vapor deposition method, and it is difficult to improve productivity or to lay the ring part included in the organic polymer compound planarly on a surface of the organic thin film layer.

As described above, the composition for organic thin film layer formation contains the organic polymer compound besides organopolysiloxane, and it is thought that it is difficult to obtain good gas barrier properties only by triazine dithiol.

Accordingly, it is supposed to be difficult to efficiently form a gas barrier film provided with an organic thin film layer having a characteristic structure.

PRIOR ART DOCUMENTS

Patent Documents

Patent Document 1: JP 4863024

SUMMARY OF THE INVENTION

Problems to be Solved by the Invention

An object of the present invention is to provide a gas barrier film which can be produced efficiently and which includes an organic thin film layer (hereinafter, referred to as organic gas barrier layer) excellent in gas barrier properties.

Solutions to the Problems

The present inventors have incorporated to an organic thin film layer a 1,3,5-triazine derivative having sulfur-containing groups as a substituent on 2, 4 and 6 positions. As a result, gas barrier properties can be obtained, and accordingly the present invention has been completed.

The gas barrier film according to the present invention is a gas barrier film comprising a plastic film and an organic gas barrier layer containing a 1,3,5-triazine derivative on at least one surface of the plastic film, wherein the 1,3,5-triazine derivative has sulfur-containing groups as a substituent on 2, 4 and 6 positions.

It is preferable that the 1,3,5-triazine derivative is triazine trithiol.

It is preferable that the organic gas barrier layer has a thickness of 100 nm or more.

It is preferable that the organic gas barrier layer is formed on the plastic film by vacuum vapor deposition method.

Effects of the Invention

The gas barrier film according to the present invention is obtained by forming an organic gas barrier layer consisting only of an organic material on a surface of a plastic film, and can be provided with excellent gas barrier properties. The gas barrier film of the present invention can be used in packaging fields for foods, pharmaceutical products, industrial products, etc.

BRIEF DESCRIPTION OF THE DRAWINGS

FIG. 1 is a schematic diagram of a vapor deposition apparatus for producing the gas barrier film of the present invention.

Mode for Carrying Out the Invention

The gas barrier film of the present invention includes a plastic film and an organic gas barrier layer formed on at least one surface of the plastic film. Hereinafter, the physical properties and method for producing the gas barrier film of the present invention will be described.

[Plastic Film]

A plastic film in the present invention is made of an organic polymer resin and is obtained by stretching in the longitudinal direction and/or width direction after melt extrusion, and then further being subjected to thermal fixation and cooling. Examples of the organic polymer resin include polyolefins such as polyethylene and polypropylene; polyesters such as polyethylene terephthalate, polybutylene terephthalate and polyethylene 2,6-naphthalate; polyamides such as nylon 6, nylon 4, nylon 66, nylon 12 and wholly aromatic polyamides; polyvinyl chloride; polyvinylidene chloride; polyvinyl alcohol; polyamide imide; polyimide; polyether imide; polysulfone; polyphenylene sulfide; polyphenylene oxide; etc. These organic polymer resins may be copolymerized with a small amount of other organic monomers or may be blended with other organic polymers.

Examples of the preferable polyesters include polyethylene terephthalate, polybutylene terephthalate, polyethylene-2,6-naphthalate, etc., and copolymers containing these polyesters as a main component may be used.

When a polyester copolymer is used, a main component as the dicarboxylic acid component of the polyester copolymer is preferably an aromatic dicarboxylic acid such as terephthalic acid, isophthalic acid, phthalic acid, or 2,6-naphthalenedicarboxylic acid. Polyfunctional carboxylic acids such as trimellitic acid and pyromellitic acid; aliphatic dicarboxylic acids such as adipic acid and sebacic acid; etc., are used as other carboxylic acid components. A main component as the glycol component of the polyester copolymer is preferably ethylene glycol or 1,4-butanediol, and aliphatic glycols such as diethylene glycol, propylene glycol and neopentyl glycol; aromatic glycols such as p-xylylene glycol; alicyclic glycols such as 1,4-cyclohexane dimethanol; polyethylene glycols having a weight average molecular weight of 150 to 20000; etc., are used as other glycol components.

The proportion of the copolymerization component in the polyester copolymer is 20% by mass or less. If the proportion of the copolymerization component exceeds 20% by mass, film strength, transparency, heat resistance, etc. may be inferior. These polyester copolymers may be copolymerized with a small amount of other organic monomers or may be blended with other organic polymers.

Examples of the preferable polyamides include polycaproamide (nylon 6), poly-ε-aminoheptanoic acid (nylon 7), poly-ε-aminononanoic acid (nylon 9), polyundecaneamide (nylon 11), polylaurinlactam (nylon 12), polyethylenediamine adipamide (nylon 2,6), polytetramethylene adipamide (nylon 4,6), polyhexamethylene adipamide (nylon 6,6), polyhexamethylene sebacamide (nylon 6,10), polyhexamethylene dodecamide (nylon 6,12), polyoctamethylene dodecamide (nylon 8,12), polyoctamethylene adipamide (nylon 8,6), polydecamethylene adipamide (nylon 10,6), polydecamethylene sebacamide (nylon 10,10), polydodecamethylene dodecamide (nylon 12,12) and metaxylylene diamine-6nylon (MXD 6). Copolymers containing these polyamides as a main component may be used.

Examples of the polyamide copolymers include a caprolactam/laurinlactam copolymer, a caprolactam/hexamethylenediammonium adipate copolymer, a laurinlactam/hexamethylenediammonium adipate copolymer, a hexamethylenediammonium adipate/hexamethylenediammonium sebacate copolymer, an ethylenediammonium adipate/hexamethylenediammonium adipate copolymer, a caprolactam/hexamethylenediammonium adipate/hexamethylenediammonium sebacate copolymer, etc.

It is also effective to add to these polyamides plasticizers such as aromatic sulfoneamides, p-hydroxybenzoic acid and esters; elastomer components with low elastic modulus; and lactams, as a flexibility improvement component of the film.

Furthermore, known additives, for example, a ultraviolet absorbing agent, an antistatic agent, a plasticizer, a lubricant, a coloring agent, etc. may be added to the above organic polymer resins. The transparency of the film is not particularly limited, but when the transparency is required, films having a light transmittance of 50% or higher are preferable.

Unless an object of the present invention is not deteriorated, the plastic film in the present invention may be subjected to a surface treatment such as a corona discharge treatment, a plasma discharge treatment, a flame treatment, or a surface-roughening treatment; a known anchor coating treatment; printing; decoration; etc. before a thin layer are formed thereon.

The thickness of the plastic film in the present invention is preferably in a range of 3 to 500 μm and more preferably in a range of 6 to 300 μm.

[Organic Gas Barrier Layer]

An organic gas barrier layer is laid on one surface or both surfaces of the plastic film.

The organic gas barrier layer contains a 1,3,5-triazine derivative. The 1,3,5-triazine derivative has sulfur-containing groups as a substituent on 2, 4 and 6 positions. The sulfur atoms preferably directly bond to carbon atoms on 2, 4 and 6 positions. The 1,3,5-triazine derivative is, for example, 1,3,5-triazine derivatives represented by the following chemical formula, and the 1,3,5-triazine derivatives may be used alone or in combination. Such a 1,3,5-triazine derivative has a structure close to a planar structure. Accordingly, it is supposed that the 1,3,5-triazine derivative can cause gas barrier properties by being incorporated to the organic gas barrier layer.

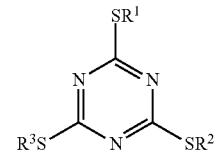

$R^1$, $R^2$, and $R^3$ in the above formula may be, for example, H, $CH_3$, $C_2H_5$, $C_4H_9$, $C_6H_{13}$, $C_8H_{17}$, $C_{10}H_{21}$, $C_{12}H_{25}$, $C_{18}H_{37}$, $C_{20}H_{41}$, $C_{22}H_{45}$, $C_{24}H_{49}$, $CF_3C_6H_4$, $C_4F_9C_5H_4$, $C_6F_{13}C_5H_4$, $C_8F_{17}C_6H_4$, $C_{10}F_{21}C_6H_4$, $C_6F_{11}C_6H_4$, $C_9F_{17}CH_2$, $C_{10}F_{21}CH_2$, $C_4F_9CH_2$, $C_6F_{13}CH_2CH_2$, $C_8F_{17}CH_2CH_2$, $C_{10}F_{21}CH_2CH_2$, $CH_2$=$CHCH_2$, $CH_2$=$CH(CH_2)_8$, $CH_2$=$CH(CH_2)_9$, $C_8H_{17}CH_2$=$C_8H_{16}$, $C_6H_{11}$, $C_6H_5CH_2$, $C_6H_5CH_2CH_2$, $CH_2$=$CH(CH_2)_4COOCH_2CH_2$, $CH_2$=$CH(CH_2)_8COOCH_2CH_2$, $CH_2$=$CH(CH_2)_9COOCH_2CH_2$, $C_4F_9CH_2$=$CHCH_2$, $C_6F_{13}CH_2$=$CHCH_2$, $C_8F_{17}CH_2$=$CHCH_2$, $C_{10}F_{21}CH_2$=$CHCH_2$, $C_4F_9CH_2CH(OH)CH_2$, $C_6F_{13}CH_2CH(OH)CH_2$, $C_8F_{17}CH_2CH(OH)CH_2$, $C_{10}F_{21}CH_2CH(OH)CH_2$, $CH_2$=$CH(CH_2)_4COO(CH_2CH_2)_2$, $CH_2$=$CH(CH_2)_8COO(CH_2CH_2)_2$, $CH_2$=$CH(CH_2)_9COO(CH_2CH_2)_2$, $C_4F_9COOCH_2CH_2$, $C_6F_{13}COOCH_2CH_2$, $C_8F_{17}COOCH_2CH_2$, $C_{10}F_{21}COOCH_2CH_2$, and $R^1$, $R^2$, and $R^3$ may be the same or different from one another.

The 1,3,5-triazine derivative is preferably triazine trithiol (thiocyanuric acid) in which all of $R^1$, $R^2$ and $R^3$ are H.

The organic gas barrier layer is preferably mainly composed of the 1,3,5-triazine derivative, and specifically preferably contain 50% by mass or more of the 1,3,5-triazine derivative. The proportion of the 1,3,5-triazine derivative is more preferably 70% by mass or more and furthermore preferably 100% by mass; that is, the organic gas barrier layer consists of the 1,3,5-triazine derivative. In the organic gas barrier layer, the lower the content of an organic polymer compound having a structure far from a planar structure, the structure possibly hindering gas barrier properties, is made, the more the 1,3,5-triazine derivative having a structure close to a planar structure is contained. Accordingly, it is supposed that the ring part included in the organic polymer compound can be layered in more planar state on a surface of the organic thin film layer, and excellent gas barrier properties of the 1,3,5-triazine derivative can be obtained sufficiently.

The thickness of the organic gas barrier layer is preferably 100 nm or more and more preferably 150 nm or more. The thickness of the organic gas barrier layer is preferably 200 nm or less.

[Physical Properties of Gas Barrier Film]

The gas barrier film has an oxygen permeability of preferably 200 ml/m$^2$dMPa or lower, more preferably 150 ml/m$^2$dMPa or lower, and furthermore preferably 100 ml/m$^2$dMPa or lower.

[Manufacturing Method]

As a method for coating the organic gas barrier layer on the plastic layer, it is preferable to employ a vapor deposition method but not a method in which an organic polymer resin is used as a binder resin. When a vapor deposition method is employed, an organic polymer compound which may possibly hinder gas barrier properties can be lowered in the organic gas barrier layer, and accordingly excellent gas barrier properties of the 1,3,5-triazine derivative can be obtained sufficiently.

Examples of the vapor deposition method include known methods of physical vapor deposition methods such as a vacuum vapor deposition method, a sputtering method and an ion plating method; and chemical vapor deposition methods such as PECVD (plasma enhanced CVD); etc. The organic gas barrier layer is preferably formed on the plastic film by vacuum vapor deposition method.

The vacuum vapor deposition method is a method for heating an organic material in vacuum, heating and evaporating a material in a crucible, and then depositing the material on the plastic film. During vacuum vapor deposition, the inside of a vapor deposition apparatus is vacuum-evacuated to lower the pressure preferably to $3.0 \times 10^{-2}$ Pa, more preferably to $1.0 \times 10^{-2}$ Pa, and most preferably to high vacuum of $1.0 \times 10^{-4}$ Pa or lower.

Resistance heating, high frequency induction heating, electron beam heating, etc., may be employed for heating the organic material. When the 1,3,5-triazine derivative is vapor-deposited on a surface of a polyethylene terephthalate film, the deposition is carried out preferably at 200 to 250° C. and more preferably at 230 to 250° C. It is also possible to introduce oxygen, nitrogen, hydrogen, argon, carbonic acid gas, water vapor, etc. as a reaction gas or to employ ozone-added or ion-assisted reactive vapor deposition. Further, the thin film formation conditions may be arbitrarily altered by applying bias to the plastic film, or heating or cooling the plastic film.

[Other Layers]

The gas barrier film of the present invention may be provided with various kinds of layers included in a known gas barrier film besides the plastic film and the organic gas barrier layer based on necessity.

For example, when the gas barrier film including the organic gas barrier layer is used as a packaging material, a heat sealable resin layer called sealant is preferably formed. The formation of the heat sealable resin layer may be usually carried out by an extrusion lamination method or a dry lamination method. A thermoplastic polymer forming the heat sealable resin layer may be any polymer which can sufficiently obtain sealant adhesion properties, and polyethylene resins such as HDPE, LDPE and LLDPE, polypropylene resins, ethylene-vinyl acetate copolymers, ethylene-α-olefin random copolymers, ionomer resins, etc can be used.

In the laminate film of the present invention, at least one of a printing layer and other plastic substrate and/or paper substrate may be laminated between the plastic film and the organic gas barrier layer or on the outside of the organic gas barrier layer.

A printing ink for forming the printing layer may be an aqueous resin-containing printing ink or a solvent-based resin-containing printing ink. Examples of the resin to be used for the printing ink include acrylic resins, urethane-based resins, polyester-based resins, vinyl chloride-based resins, vinyl acetate copolymer resins, and their mixtures. The printing ink may contain known additives such as an antistatic agent, a lightproof agent, an ultraviolet absorber, a plasticizer, a lubricant, a filler, a coloring agent, a stabilizer, a lubricant, a defoaming agent, a crosslinking agent, an anti-blocking agent and an antioxidant. A printing method for forming the printing layer is not particularly limited, and known printing methods such as an offset printing method, a gravure printing method and a screen printing method may be employed. In order to dry the solvent after printing, known drying methods such as hot air drying, hot roll drying and infrared drying may be employed.

On the other hand, examples of the other plastic substrate and the paper substrate to be preferably used include paper, polyester resins, polyamide resins, biodegradable resins, etc., from the viewpoint of providing the laminated body with sufficient rigidity and strength. A stretched film such as a biaxially stretched polyester film or a biaxially stretched nylon film is preferable for making the film excellent in mechanical strength.

The present application claims the benefit of the priority date of Japanese patent application No. 2013-021809 filed on Feb. 6, 2013. All of the contents of the Japanese patent application No. 2013-021809 filed on Feb. 6, 2013, are incorporated by reference.

EXAMPLES

Hereinafter, the present invention will be specifically described with reference to examples, but the invention is not limited to the following examples and can be carried out by appropriate modifications within a range adaptable to the above-mentioned and the later-described purposes, and all the modifications are encompassed within the technical scope of the invention.

(1) Method for Evaluation of Oxygen Permeability

According to an electrolytic sensor method in JIS-K7126-2 (B method: isopiestic method), each sample was subjected to oxygen permeability measurement in normal state under an atmosphere of a temperature of 23° C. and a humidity of 65% RH by using an oxygen permeability measurement apparatus ("OX-TRAN 2/21", manufactured by MOCON). The oxygen permeability measurement was carried out in the direction of permeating each gas barrier film from the organic gas barrier layer side to the plastic film side with oxygen.

FIG. 1 is a schematic diagram of a vapor deposition apparatus for producing the gas barrier film of the present invention, but the vapor deposition apparatus is not limited to this apparatus.

In FIG. 1, 1 denotes a substrate (film), specifically a film which is fed out from a winding roll; and 2 denotes a roll supporting the film 1, and the film 1 is moved along rolls 3 and 3'. Alternatively, a sheet film having a specified size may be fixed to metal fittings. A crucible 4 is for holding a 1,3,5-triazine derivative 5, and the 1,3,5-triazine derivative evaporated by heating is vapor-deposited on film 1. The apparatus illustrated in FIG. 1 is housed in a vacuum chamber (not illustrated) which can be vacuumed to 1.0×10$^{-5}$ Pa.

Example 1

First, a polyethylene terephthalate film ("COSMOSHINE (registered trademark) A4100", manufactured by TOYOBO Co., Ltd., thickness: 50 μm) was set on a position opposite to the crucible 4 in the vapor deposition apparatus, and the inside of the crucible 4 was filled with 5 g of triazine trithiol (manufactured by Tokyo Kagaku Kogyo K.K.). Next, the inside of the vapor deposition apparatus was vacuum-evacuated to lower the pressure to 5.0×10$^{-5}$ Pa, and thereafter, the triazine trithiol in the crucible 4 was heated at 80° C. for 60 minutes to remove water, impurities, etc. Then, the triazine trithiol was heated to 250° C., and was vapor-deposited on the surface of the polyethylene terephthalate film, so that a gas barrier film was obtained which included an organic gas barrier layer having a thickness of 200 nm on the polyethylene terephthalate film. The physical properties and evaluation results of the obtained gas barrier film are shown in Table 1.

Example 2

A gas barrier film was obtained in the same manner as in Example 1, except that the amount of the triazine trithiol was adjusted so as to change the thickness of the organic gas barrier layer to 150 nm in Example 1. The physical properties and evaluation results of the obtained gas barrier film are shown in Table 1.

Example 3

A gas barrier film was obtained in the same manner as in Example 1, except that the amount of the triazine trithiol was adjusted so as to change the thickness of the organic gas barrier layer to 100 nm in Example 1. The physical properties and evaluation results of the obtained gas barrier film are shown in Table 1.

Comparative Example 1

A gas barrier film was obtained in the same manner as in Example 1, except that the vapor deposition raw material was changed to 2-amino-1,3,5-triazine-4,6-diol (manufactured by Alfa-Aesar) (hereinafter, referred to as triazine dithiol) in Example 1. The physical properties and evaluation results of the obtained gas barrier film are shown in Table 1.

Comparative Example 2

A gas barrier film was obtained in the same manner as in Example 1, except that the vapor deposition raw material was changed to triazine dithiol and the amount of the triazine dithiol was adjusted to change the thickness of the organic gas barrier layer to 150 nm in Example 1. The physical properties and evaluation results of the obtained gas barrier film are shown in Table 1.

Comparative Example 3

A gas barrier film was obtained in the same manner as in Example 1, except that the vapor deposition raw material was changed to triazine dithiol and the amount of the triazine dithiol was adjusted to change the thickness of the organic gas barrier layer to 100 nm in Example 1. The physical properties and evaluation results of the obtained gas barrier film are shown in Table 1.

Comparative Example 4

A gas barrier film was obtained in the same manner as in Example 1, except that the vapor deposition raw material was changed to triazine dithiol and the amount of the triazine dithiol was adjusted to change the thickness of the organic gas barrier layer to 50 nm in Example 1. The physical properties and evaluation results of the obtained gas barrier film are shown in Table 1.

Comparative Example 5

Evaluations were carried out in the state where no organic gas barrier layer was formed on the polyethylene terephthalate film used in Example 1. The physical properties and the evaluation results are shown in Table 1.

TABLE 1

| | polyester film | vapor deposition raw material | thickness of the organic gas barrier layer (nm) | oxygen permeability (ml/m$^2$dMPa) |
|---|---|---|---|---|
| Example 1 | PET | triazine trithiol | 200 | 30 |
| Example 2 | PET | triazine trithiol | 150 | 32 |
| Example 3 | PET | triazine trithiol | 100 | 50 |
| Comparative Example 1 | PET | triazine dithiol | 200 | 230 |
| Comparative Example 2 | PET | triazine dithiol | 150 | 227 |
| Comparative Example 3 | PET | triazine dithiol | 100 | 210 |
| Comparative Example 4 | PET | triazine dithiol | 50 | 219 |
| Comparative Example 5 | PET | — | 0 | 250 |

INDUSTRIAL APPLICABILITY

The gas barrier film of the present invention can obtain gas barrier properties even when an organic gas barrier layer is formed on a surface of a plastic film. Consequently, the gas barrier film of the present invention can be used in packaging fields for foods, pharmaceutical products, industrial products, etc.

DESCRIPTION OF THE NUMERALS 1 film
2 roll
3, 3' roll
4 crucible
5 1,3,5-triazine derivative

The invention claimed is:
1. A gas barrier film comprising a plastic film and an organic gas barrier layer containing a 1,3,5-triazine derivative on at least one surface of the plastic film, wherein
the 1,3,5-triazine derivative has sulfur-containing groups as a substituent on 2, 4 and 6 positions, and
the organic gas barrier layer has a thickness of 200 nm or less.
2. The gas barrier film according to claim 1, wherein the 1,3,5-triazine derivative is triazine trithiol.

3. The gas barrier film according to claim 2, wherein the organic gas barrier layer has a thickness of 100 nm or more.

4. The gas barrier film according to claim 3, wherein the organic gas barrier layer is formed on the plastic film by vacuum vapor deposition method.

5. The gas barrier film according to claim 2, wherein the organic gas barrier layer is formed on the plastic film by vacuum vapor deposition method.

6. The gas barrier film according to claim 1, wherein the organic gas barrier layer has a thickness of 100 nm or more.

7. The gas barrier film according to claim 6, wherein the organic gas barrier layer is formed on the plastic film by vacuum vapor deposition method.

8. The gas barrier film according to claim 1, wherein the organic gas barrier layer is formed on the plastic film by vacuum vapor deposition method.

* * * * *